(12) United States Patent
Lin et al.

(10) Patent No.: US 8,952,544 B2
(45) Date of Patent: Feb. 10, 2015

(54) SEMICONDUCTOR DEVICE AND MANUFACTURING METHOD THEREOF

(71) Applicant: Taiwan Semiconductor Manufacturing Company Ltd., Hsinchu (TW)

(72) Inventors: Jing-Cheng Lin, Hsinchu Country (TW); Jui-Pin Hung, Hsinchu (TW); Po-Hao Tsai, Taoyuan County (TW)

(73) Assignee: Taiwan Semiconductor Manufacturing Company Ltd., Hsinchu (TW)

( * ) Notice: Subject to any disclaimer, the term of this patent is extended or adjusted under 35 U.S.C. 154(b) by 0 days.

(21) Appl. No.: 13/935,167

(22) Filed: Jul. 3, 2013

(65) Prior Publication Data
US 2015/0008587 A1  Jan. 8, 2015

(51) Int. Cl.
| | |
|---|---|
| H01L 23/48 | (2006.01) |
| H01L 23/52 | (2006.01) |
| H01L 29/40 | (2006.01) |
| H01L 23/373 | (2006.01) |
| H01L 21/768 | (2006.01) |

(52) U.S. Cl.
CPC ........ H01L 23/373 (2013.01); H01L 21/76841 (2013.01); H01L 23/481 (2013.01)
USPC .............................. 257/774; 257/76; 438/113

(58) Field of Classification Search
USPC ..................... 257/76, 774, E21.599; 438/113
See application file for complete search history.

(56) References Cited

U.S. PATENT DOCUMENTS

| | | | | |
|---|---|---|---|---|
| 7,944,038 | B2 * | 5/2011 | Chiu et al. ...................... | 257/690 |
| 8,541,260 | B1 * | 9/2013 | Darveaux et al. .............. | 438/106 |
| 2005/0263891 | A1 * | 12/2005 | Lee et al. ........................ | 257/751 |
| 2011/0156250 | A1 * | 6/2011 | Goh et al. ....................... | 257/738 |
| 2012/0126417 | A1 * | 5/2012 | Chiu .............................. | 257/774 |
| 2013/0249045 | A1 * | 9/2013 | Kang et al. ..................... | 257/499 |
| 2013/0292684 | A1 * | 11/2013 | Nikitin et al. .................... | 257/76 |
| 2014/0131876 | A1 * | 5/2014 | Hua et al. ....................... | 257/762 |

* cited by examiner

*Primary Examiner* — Phuc Dang
(74) *Attorney, Agent, or Firm* — WPAT, P.C.; Anthony King; Kay Yang

(57) ABSTRACT

A fan-out package includes a molding compound, a conductive plug and a stress buffer. The conductive plug is in the molding compound. The stress buffer is between the conductive plug and the molding compound. The stress buffer has a coefficient of thermal expansion (CTE). The CTE of the stress buffer is between a CTE of the molding compound and a CTE of the conductive plug. A method of manufacturing a three dimensional includes plating a post on a substrate, and disposing a stress buffer on the sidewall of the post. The method further includes surrounding the stress buffer with a molding compound.

17 Claims, 23 Drawing Sheets

SEMICONDUCTOR DEVICE AND MANUFACTURING METHOD THEREOF

FIELD

The disclosure relates to a semiconductor device, and more particularly to a three dimensional integrated fan out package.

BACKGROUND

Semiconductor device is widely adopted in various applications. The geometry is trending down rapidly as user's demands increases on the performance and functionality. For example, a 3G mobile phone presented in the market is expected to be capable of telecommunicating, capturing images and processing high stream data. In order to fulfill the requirements, the 3G mobile phone needs to be equipped with different devices such as a processor, a memory and an image sensor in a limited space.

Combining several semiconductor devices in one package is an approach to enhance the performance by integrating devices with various functions into a single component. Roadmap in the field shows a three dimensional package with a multi-level structure for a superior and miniature-sized semiconductor component.

A three dimensional integrated semiconductor package contains several different sub-structures. The sub-structures are arranged in a stack manner and are either in contact with each other or linked by interconnects. However, on the other hand, different properties of the sub-structures also create challenges to a designer. Compared to a two dimensional semiconductor package, failure modes increase for a comparatively more complex three dimensional integrated semiconductor package. As such, improvements in the structure and method for a three dimensional semiconductor package continue to be sought.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE INVENTION

Figure 1:
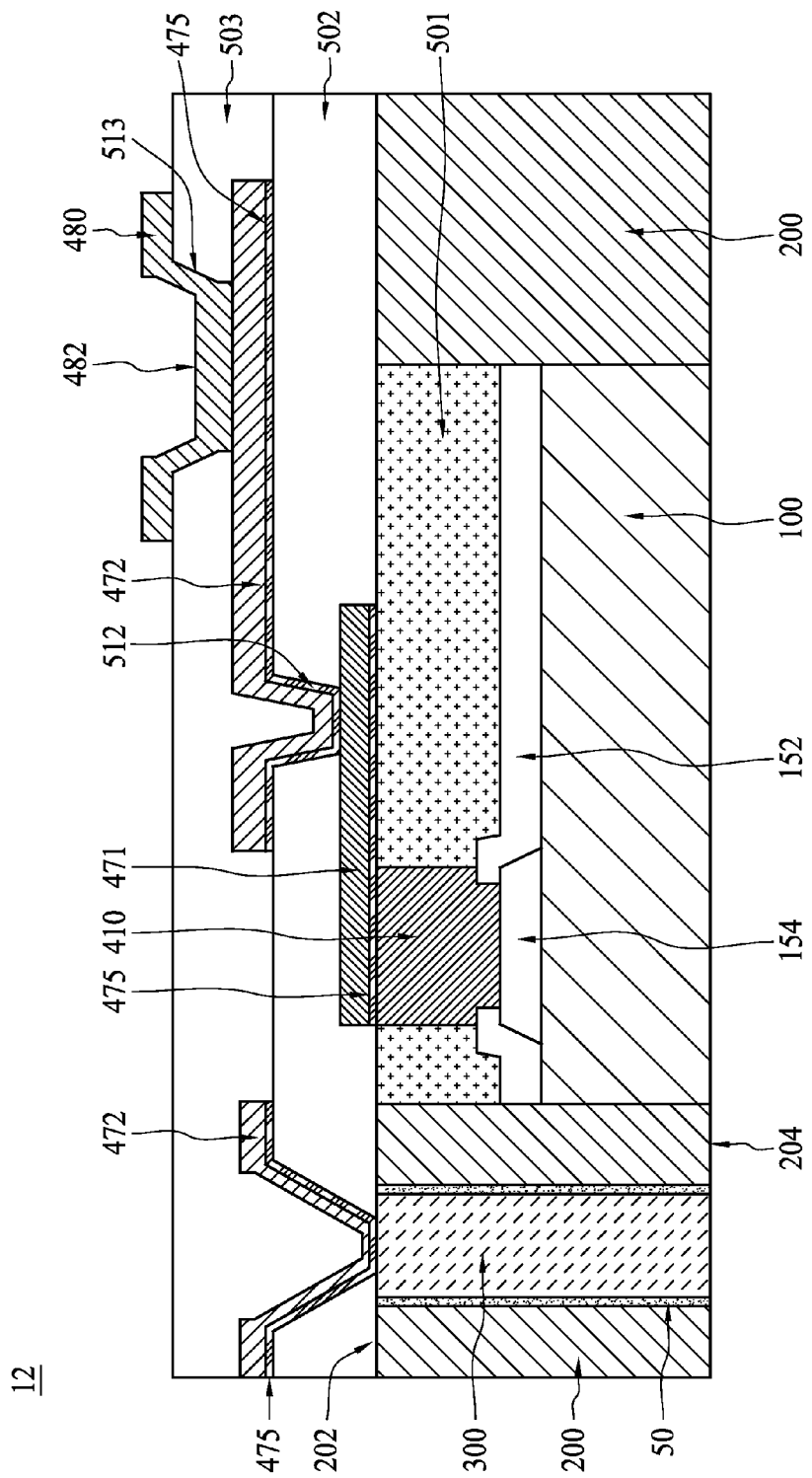
FIG. 1 is a schematic of a three dimensional semiconductor structure.

In the present disclosure, a three dimensional (3D) semiconductor structure is designed to prevent a crack generated from a location in the 3D semiconductor structure. The 3D semiconductor structure provides a package for a semiconductor chip. The semiconductor chip is enclosed inside the 3D semiconductor structure and electrically connected to an external circuit through interconnects in the structure. In some embodiments, the 3D semiconductor structure is a fan out package. In some embodiments, the 3D semiconductor structure is an integrated fan out package-on-package (POP) device.

The 3D semiconductor structure is composed of two or more different substructures. In some embodiments, the substructures are dielectric, molding material, electrical interconnects, filled vias or plugs, and contact pads. In some embodiments, the dielectric is disposed between two conductive layers and formed with a polymer material such as epoxy, polyimide, polybenzoxazole (PBO), and the like. In some embodiments, the dielectric is disposed on the semiconductor chip that is placed in the 3D semiconductor structure. The dielectric can also include spin-on glass (SOG), silicon oxide, silicon oxynitride, or the like, by any suitable method such as spin coating or vapor deposition.

The molding material is a compound and formed with composite materials including epoxy resins, phenolic hardeners, silicas, catalysts, pigments, and mold release agents. Material for forming a molding compound has a high thermal conductivity, a low moisture absorption rate, a high flexural strength at board-mounting temperatures, or a combination of these.

The electrical interconnects are conductive lines or films routed inside the 3D semiconductor structure. In some embodiments, the electrical interconnects are redistribution layers (RDL). The RDLs are used for a fan-in or a fan-out process. In some embodiments, the electrical interconnects are formed with a conductive material such as gold, silver, copper, nickel, tungsten, aluminum, and/or alloys thereof.

In some embodiments, a filled via or conductive plug in the present disclosure is a conductive post. The filled via or plug is conductive and is disposed in a substructure such as a carrier, a substrate, or a molding compound. The conductive filled via or plug is arranged to extend through the substructure and provides an electrical communication between a top surface and a bottom surface of the substructure.

In some embodiments, a contact pad is disposed on a top surface of the 3D semiconductor structure. A top surface of the contact pad receives a solder ball or solder paste and acts as a terminal to connect the 3D semiconductor structure to an external circuit. A bottom surface of the contact pads is connected to an interconnect, such as an RDL. In some embodiments, the contact pad is an under bump metallization (UBM). A solder ball or solder paste is placed on the top surface of the UBM so that the 3D structure can be electrically connected to an external device. In some embodiments, the UBM is formed with a conductive material such as gold, silver, copper, nickel, tungsten, aluminum, and/or alloys thereof.

In some embodiments, a 3D semiconductor structure has a conductive pillar disposed on a semiconductor chip. The semiconductor chip is placed in the 3D semiconductor structure. The conductive pillar is electrically connected with a bond pad of the semiconductor at one end. The conductive pillar is electrically connected with an interconnect such as an RDL at the other end. In some embodiments, a conductive pillar is a conductive bump. The conductive pillar is formed with a conductive material such as gold, silver, copper, nickel, tungsten, aluminum, tin and/or alloys thereof. Formation of the conductive pillar can be by a process such as evaporation, electroplating, vapor deposition, sputtering or screen printing.

In some embodiments, a 3D semiconductor structure is manufactured using a wafer scale package (WSP) operation. In some embodiments, the 3D semiconductor structure is manufactured using a chip level package operation. In some embodiments, the 3D semiconductor structure is manufactured using a flip chip operation.

The 3D semiconductor structure has a layer disposed between two different substructures. The layer is a stress buffer, also called a liner. The stress buffer or liner is designed to avoid a crack caused by an internal stress. In some embodiments, the internal stress originates from a difference in thermal expansion between the two different substructures. The thermal expansion difference is because a difference in a coefficient of thermal expansion (CTE) of the substructure materials between the two different substructures.

The term "CTE" in the present disclosure is a property of an object when it is heated or cooled. An object's length changes by an amount proportional to the original length and the change in temperature. The unit of CTE is ppm/K, which stands for $10^{-6}$ m/m K. The CTE unit is shortened to "ppm" hereinafter. In the present disclosure, the CTE of pure copper is 16.6 ppm, and the CTE of pure silicon is 3 ppm. CTE of each material may be in a range according to the concentration of the impurity in the material. For a molding compound material, the CTE is dependent on the composition of the molding compound and may be a wide range up to over hundred ppm.

In some embodiments, a 3D semiconductor structure has a stress buffer or liner between at least two substructures. The stress buffer or liner has a CTE that is between a CTE of one substructure and a CTE of the other substructure. The stress buffer or liner may be formed with an electrically conductive or electrically insulating material. In the present disclosure, the stress buffer or liner is, but is not limited to, immersion tin, electroless nickel electroless palladium immersion gold (ENEPIG), electroless nickel electroless palladium (ENEP), polybenzoxazole (PBO), polyimide and the like. In some embodiments, the stress buffer or liner is a composite film including at least two different films.

FIG. 1 is a 3D semiconductor structure 12. The 3D semiconductor structure 12 has a semiconductor chip 100. The semiconductor chip 100 is located at the bottom of the structure 12. In certain embodiments, the semiconductor chip 100 is on a die attached film (DAF). The semiconductor structure 12 is a package of the semiconductor chip 100. The semiconductor chip 100 has a front side and a backside. A bond pad 154 of the semiconductor chip 100 is disposed on the front side. In some embodiments, the backside of the semiconductor is bonded with a heat dissipation layer, an adhesion layer, or a buffer layer. The semiconductor chip 100 has a passivation 152 on the front side around the bond pad 154. The passivation 152 is formed with dielectric materials, such as spin-on glass (SOG), silicon oxide, silicon oxynitride, silicon nitride or the like. The passivation 152 provides an electrical isolation and a moisture protection for the semiconductor chip 100. The passivation is formed with a vapor deposition or a spin coating process.

Molding compound 200 is formed to surround sidewalls of the semiconductor chip 100. The molding compound 200 has a top surface 202 and a bottom surface 204. In some embodiments, the bottom surface 204 and the backside of the semiconductor chip 100 form a surface of the semiconductor structure 12. For embodiments having a DAF under the semiconductor chip, the bottom surface 204 and the DAF form a surface of the semiconductor structure 12. The molding compound 200 can be a single layer film or a composite film stack. For certain embodiments, the 3D semiconductor structure 12 has a bas buffer under the semiconductor chip 100 and the molding compound 200.

The 3D semiconductor structure 12 has a conductive filled via or plug 300 in the molding compound 200. In some embodiments, the conductive filled via or plug 300 extends from the top surface 202 of the molding compound 200 to the bottom surface 204 of the molding compound 200. The conductive filled via or plug 300 is connected with an interconnection 472 at one end of the conductive filled via or plug 300. For the other end of the conductive filled via or plug 300, the conductive filled via or plug 300 is available as a terminal for the 3D semiconductor structure 12 to be electrically connected with an external circuit located at the backside of the 3D semiconductor structure. In certain embodiments, one end of the filled-via 30 is connected to the cover 40 and the other end is connected with an external circuit located at a buffer layer. The buffer layer is disposed on the bottom surface of the semiconductor structure 10.

A conductive pillar 410 is disposed on the top surface of the bond pad 154. The conductive pillar 410 is electrically connected to the bond pad 154 of the semiconductor chip 100 at one end. The conductive pillar 410 is electrically connected with an interconnect 471 at the other end. A first dielectric 501 is disposed on the semiconductor chip 100. The conductive pillar 410 is surrounded by the first dielectric 501. In some embodiments, the first dielectric 501 is a buffer between the passivation 152 and other dielectric layers over the first dielectric 501.

Interconnects such as 471 and 472 are included in the semiconductor structure 12. Interconnects labeled with a same number in a same drawing are formed during a same operation. The interconnects 471 and 472 are electrical connections to and/or between the semiconductor chip 100 and an external circuit. In FIG. 1, an interconnect 471 on the first dielectric 501 is electrically connected with the conductive pillar 410 at one end. The interconnect 471 is electrically connected with an interconnect 472 at the other end. For certain embodiments as in FIG. 1, the interconnects 471 and 472 has a seed layer 475.

A UBM 480 is placed on a top surface of the semiconductor structure 12. The UBM 480 has a bottom portion connected with an RDL 472. The UBM 480 has a top surface 482, which receives a solder ball or a solder paste.

In FIG. 1, the 3D semiconductor structure 12 has a second dielectric 502, and a third dielectric 503. The second dielectric 502 is on the dielectric 501, the conductive filled via or plug 300 and the molding compound 200. The second dielectric 502 provides isolation between the RDL 471 and the RDL 472. The second dielectric 502 has a through structure 512 filled with interconnect 472 and third dielectric 503. The RDL 472 is electrically connected with the RDL 471 in the through hole 512. The third dielectric 503 is formed on the second dielectric 502 and the RDL 472. The third dielectric 503 protects the RDL 472 from being exposed to ambient conditions. The third dielectric 503 has a through structure 513 filled with UBM 480. The UBM 480 is formed in the through structure 513 and electrically connected with an RDL 472.

The 3D semiconductor structure 12 has a liner 50 interposed between the molding compound 200 and the conductive plug 300. The liner 50 acts as a stress buffer between the molding compound 200 and the conductive filled via or plug 300. The liner 50 has a CTE that is between a CTE of the molding compound 200 and the conductive plug 300. When a thermal process (heating or cooling) is applied on the 3D semiconductor structure 12, dimension change for the molding compound 200 is greater than for the conductive plug 300. For example, in some embodiments, a 3D semiconductor structure has a molding compound formed with epoxy with a CTE of 55 ppm and a conductive plug formed with copper with a CTE of 16 ppm. The large CTE mismatch (over 3 times) between the molding compound and the conductive filled via or plug generates an internal stress in the semiconductor structure, especially at an interface between the molding compound and the conductive plug. With a stress buffer layer, such as tin (CTE is around 23.4 ppm), disposed between the molding compound and the conductive plug, the gradient of CTE across the interface is reduced. Because the CTE of the stress buffer layer is between the molding compound and the conductive plug, the dimension change for the stress buffer layer is between that of the molding compound and the conductive plug. The internal stress is reduced because the CTE mismatch between adjacent films is decreased. In some embodiments, the CTE of the stress buffer layer is between about 9 ppm and about 90 ppm. In some embodiments, the CTE of the stress buffer layer is between about 25 ppm and about 70 ppm.

Figure 2:
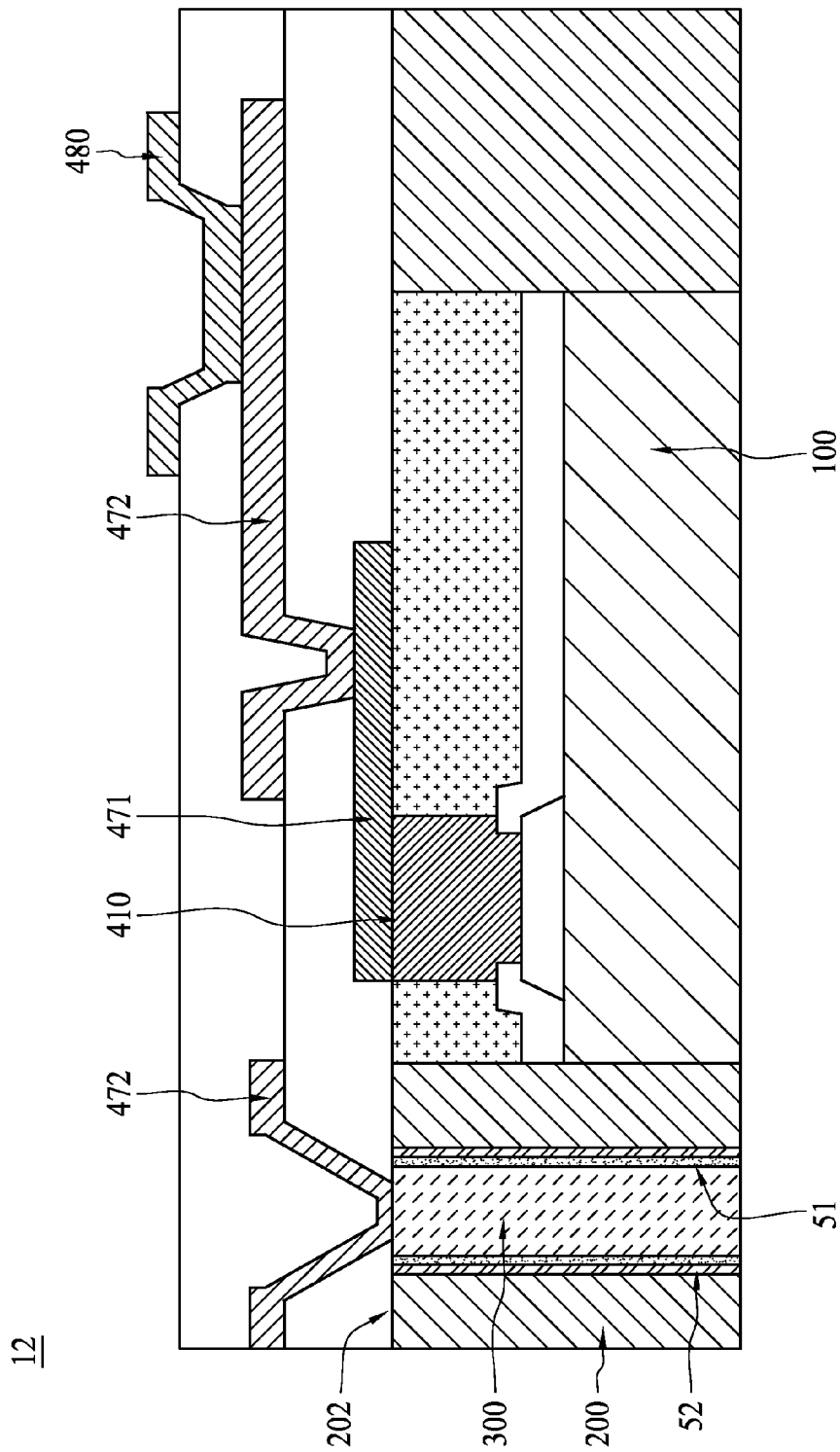
FIG. 2 is a 3D semiconductor structure which has a composite stress buffer between a molding compound 200 and a conductive plug.

In some embodiments, a liner as a stress buffer between a molding compound and a conductive filled via or plug is a composite film. The composite stress buffer has two or more stress buffer layers. In some embodiments, the stress buffer layer disposed closest to the conductive filled via or plug has a smallest CTE among all the stress buffer layers. In FIG. 2, a 3D semiconductor structure 12 has a composite stress buffer between a molding compound 200 and a conductive plug 300. The composite stress buffer has a first stress buffer layer 51 and a second stress buffer layer 52. The second stress buffer layer 52 is between the molding compound 200 and the first stress buffer layer 51. The first stress buffer layer 51 is between the second stress buffer layer 52 and the conductive plug 300. The second stress buffer layer 52 has a CTE that is between the CTE of the molding compound 200 and the CTE of the first stress buffer layer 51. The first stress buffer layer 51 has a CTE that is between the CTE of the second stress buffer layer 52 and the conductive filled via or plug 300.

In some embodiments, the second stress buffer layer 52 is tellurium, which has a CTE around 37 ppm. The first stress buffer layer 51 is strontium, which has a CTE around 22.5 ppm. In some embodiments, the first stress buffer is nickel and the second stress buffer is immersion gold, palladium, of combinations thereof. The molding compound 200 is epoxy having a CTE around 75 ppm, and the conductive plug 300 is copper having a CTE around 16.6 ppm. The gradient of CTE change between the molding compound 200 and the conductive plug 300 is further reduced by the design of composite stress buffer. In some embodiments, the composite stress buffer has more than two different stress buffer layers between the molding compound and the conductive plug in order to change the gradient of CTE from the molding compound to the conductive filled via or plug.

In some embodiments, a 3D semiconductor structure has a composite stress buffer and the composite stress buffer has one stress buffer layer formed with electrically conductive material and another stress buffer layer formed with electrically insulating material. For example, in some embodiments, a composite stress buffer has a stress buffer layer formed with polypropylene and another stress buffer made with silver. In certain some embodiments, a 3D semiconductor structure has a composite stress buffer and the composite stress buffer has all stress buffer layers formed with an electrically insulating material.

Figure 3:
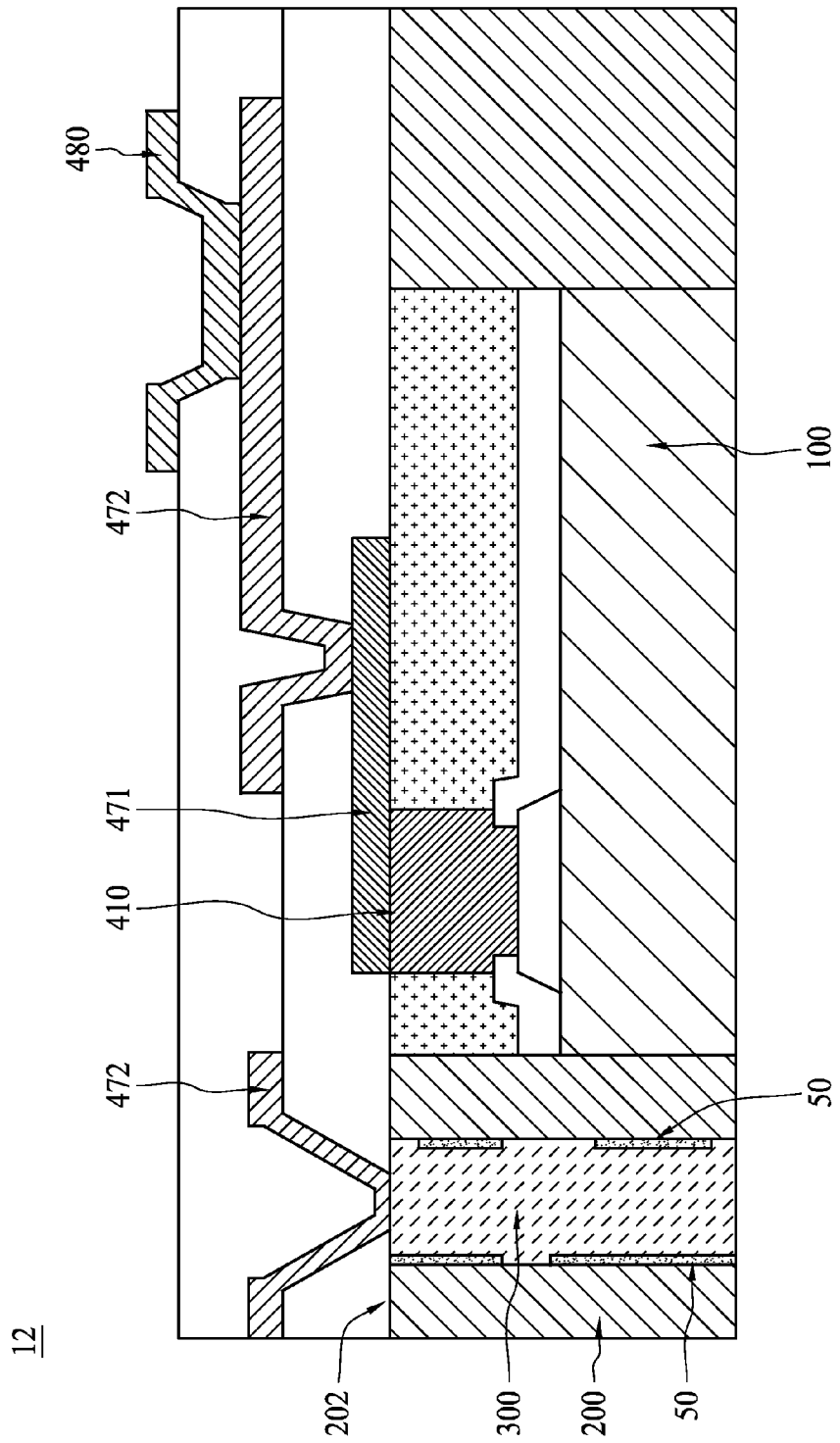
FIG. 3 is a semiconductor structure including a liner as a stress buffer.

In some embodiments, a liner or stress buffer disposed between a molding compound and a conductive plug is not a continuous layer. The liner or stress buffer may have several separated sections. In FIG. 3, a 3D semiconductor structure 12 has a molding compound 200, a conductive plug 300 and a liner 50. The liner 50 is between the molding compound 200 and the conductive plug 300. The liner 50 has two separated sections for each side. In some embodiments, the liner 50 has at least one section extending to the top surface 202 of the molding compound 200. In some embodiments, the liner has at least three separated sections for each side.

In various embodiments, a liner or stress buffer disposed between a molding compound and a conductive plug. The liner or stress buffer does not cover a portion of the interface between the molding compound and the conductive plug. Thus, a portion of the conductive plug contacts the molding compound.

Figure 4:
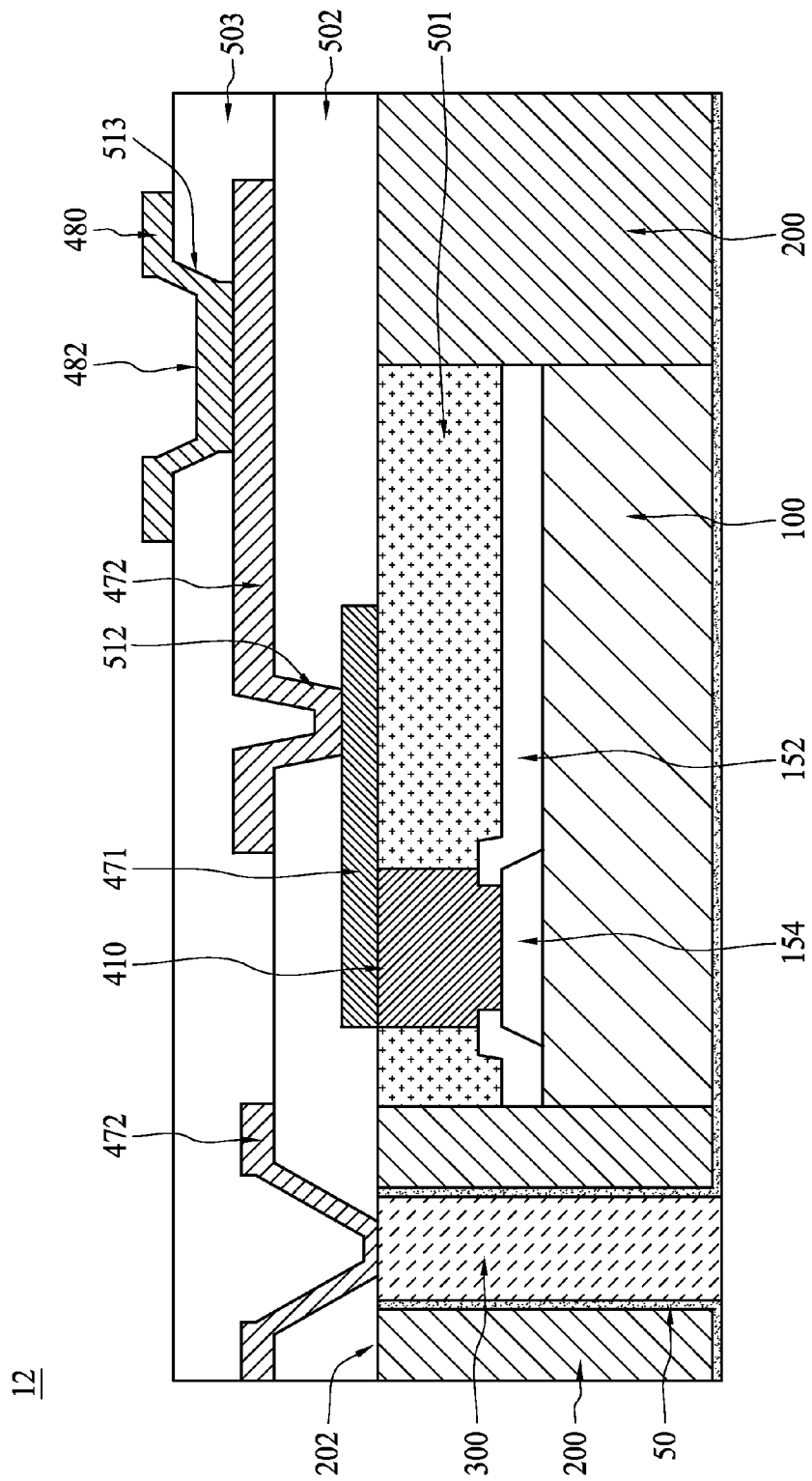
FIG. 4 is a semiconductor structure including a liner as a stress buffer and the liner is under a bottom surface of a molding compound.

In some embodiments, a liner as a stress buffer is further disposed on a bottom surface of the molding compound. In FIG. 4, a liner 50 is between the molding compound 200 and the conductive plug 300. The liner 50 is further disposed on a bottom surface 204 of the molding compound 200 and the bottom of the die 100. In certain embodiments, the liner 50 is disposed on a backside of a DAF. In still other embodiments, the liner 50 is disposed on a base buffer. The base buffer is disposed on the backside of the molding compound and the backside of the DAF.

In some embodiments, thickness of a liner or stress buffer is between 0.2 μm and about 5 μm. In some embodiments, thickness of a liner or stress buffer is between 1 μm and 4 μm. In some embodiments, thickness of a liner or stress buffer is between 1.5 μm and 3.5 μm.

Figure 5:
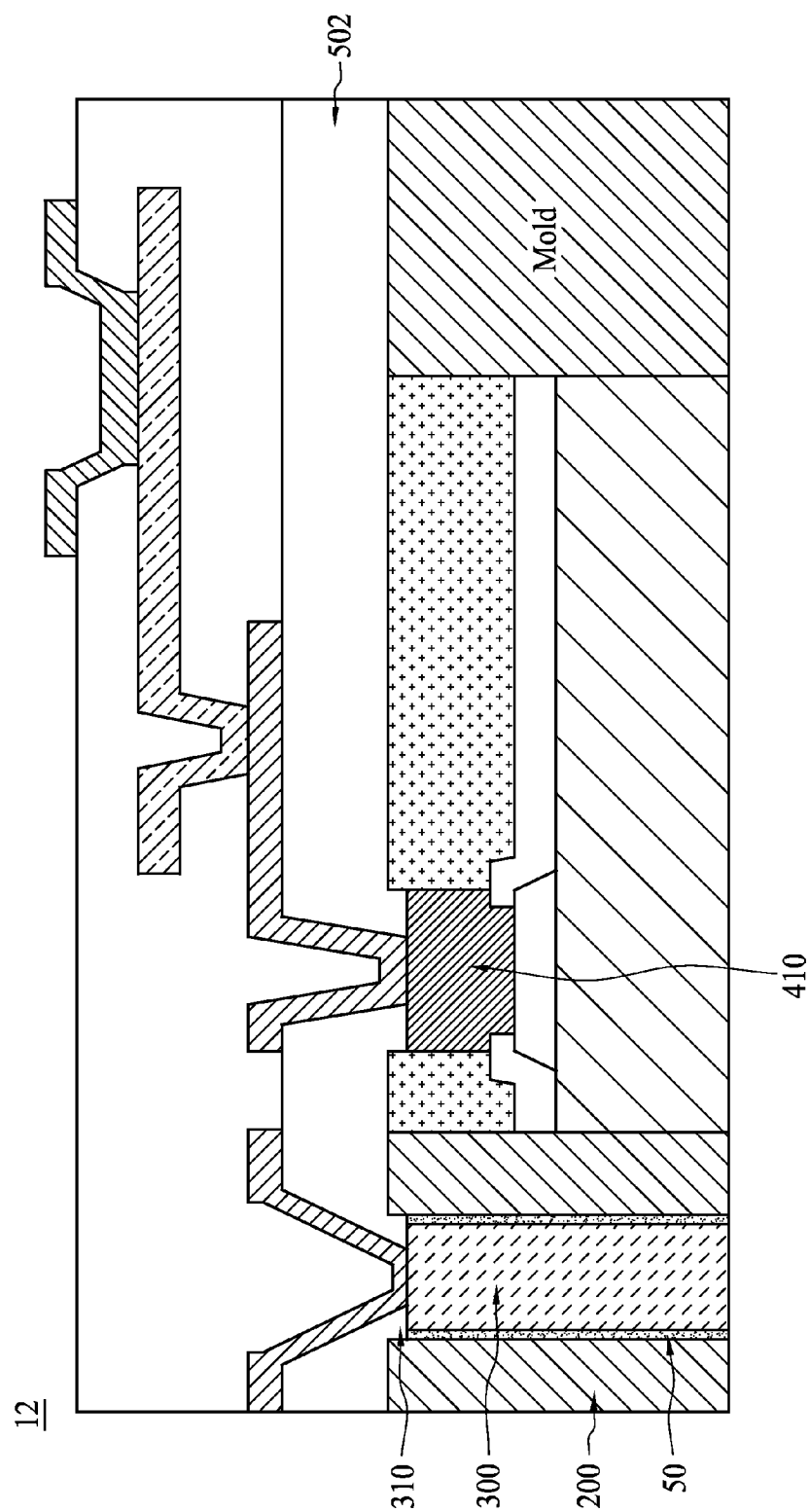
FIG. 5 is a semiconductor structure including a recess on a top corner of a conductive plug.

For some embodiments as in FIG. 5, a 3D semiconductor structure 12 has a stress buffer 50 between a molding compound 200 and a conductive filled via or plug 300. The top surface of the conductive via or plug 300 is recessed below the top surface of the molding compound 200. The top surface of the conductive via or plug 300 is below the top surface of the molding compound 200. In certain embodiments, the conductive filled via or plug 300 has a recessed top surface 310 around a top corner of the conductive filled via or plug 300. The recessed top surface 310 is filled with a second dielectric 502. In some embodiments, the recessed top surface 310 is in a ring shape from a top view perspective. In certain embodiments, the top surface of the liner or stress buffer 50 is coplanar with the top surface of the molding compound 200. In certain embodiments, the top surface of the liner of stress buffer 50 is coplanar with the top surface of the recessed top surface of the conductive plug 300. In certain embodiments, the top surface of the liner or stress buffer 50 is between the top surface of the molding compound 200 and the recessed top surface of the conductive plug 300. In certain embodiments as in FIG. 5, the top surface of the conductive pillar 410 is recessed. The top surface of the conductive pillar 410 is lower than the top surface of a first dielectric 501.

Figure 6:
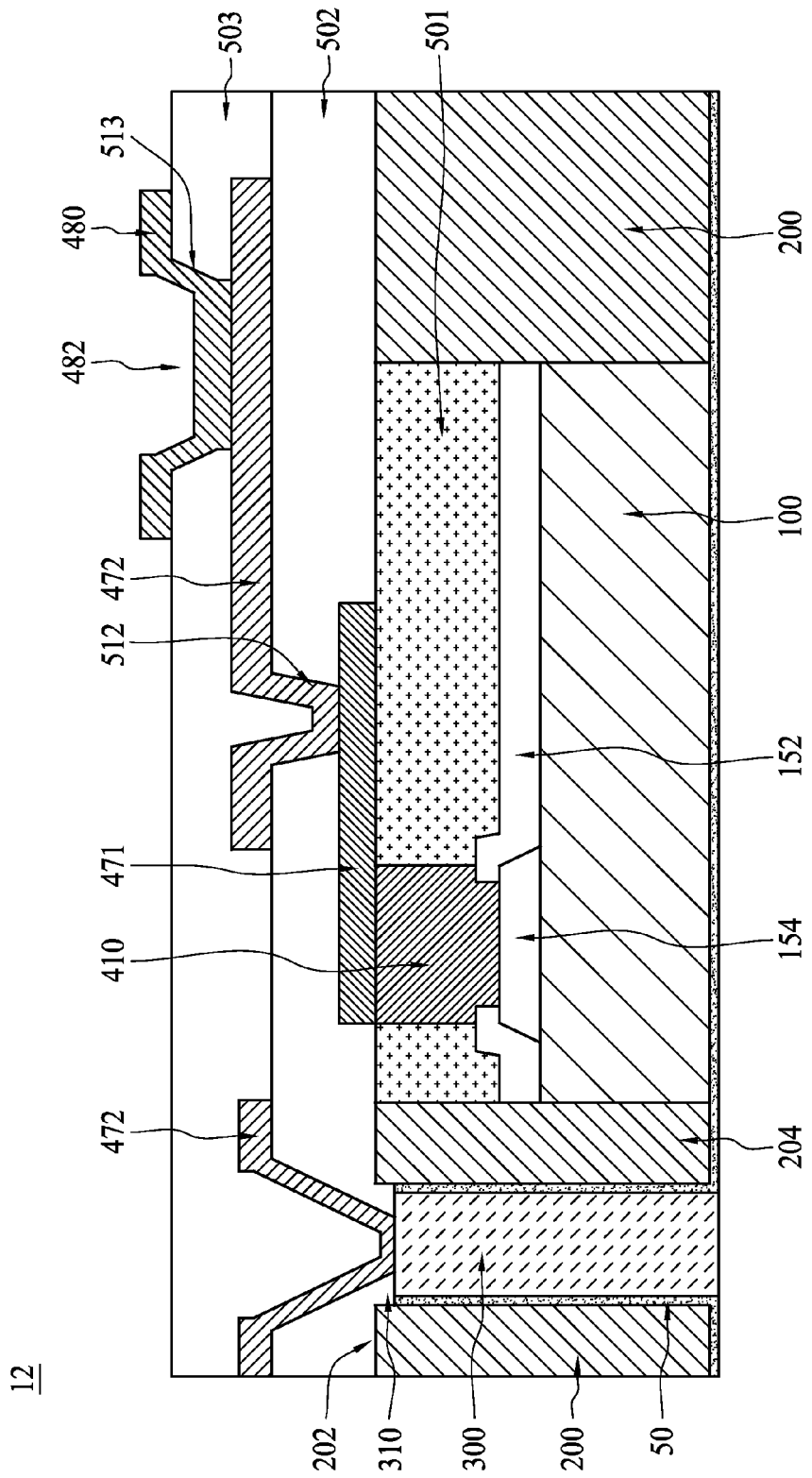
FIG. 6 is a semiconductor structure including a recess on a top corner of a conductive plug.

For some embodiments as in FIG. 6, a 3D semiconductor structure 12 has a liner or stress buffer 50 between a molding compound 200 and a conductive filled via or plug 300. A semiconductor die 100 is placed at the bottom of the 3D semiconductor structure 12. The liner or stress buffer 50 is further disposed on the bottom surface of the molding compound 200 and the bottom of the semiconductor die 100. The top surface of the conductive via or plug 300 is recessed below the top surface of the molding compound 200. The top surface of the conductive via or plug 300 is below the top surface of the molding compound 200. The conductive plug 300 has a recessed top surface 310 around a top corner of the conductive plug 300. The recessed top surface 310 is filled with a second dielectric 502. In some embodiments, the recessed top surface 310 is in a ring shape from a top view perspective. In certain embodiments, the top surface of the liner or stress buffer 50 is coplanar with the top surface 202 of the molding compound 200. In certain embodiments, the top surface of the liner of stress buffer 50 is coplanar with the top surface of the recessed top surface of the conductive plug 300. In certain embodiments, the top surface of the liner stress buffer 50 is between the top surface of the molding compound 200 and the recessed top surface of the conductive plug 300.

A method of manufacturing a 3D semiconductor structure and the semiconductor structure has a liner designed as a stress buffer between two different substructures. The method includes a number of operations and the description and illustration are not deemed as a limitation as the order of the operations.

A term "patterning" or "patterned" is used in the present disclosure to describe an operation of forming a predetermined pattern on a surface. The patterning operation includes various steps and processes and varies in accordance with the features of embodiments. In some embodiments, a patterning operation is adopted to pattern an existing film or layer. The patterning operation includes forming a mask on the existing film or layer and removing the unmasked film or layer with an etch or other removal process. The mask is a photo resist, or a hardmask. In some embodiments, a patterning operation is adopted to form a patterned layer directly on a surface. The patterning operation includes forming a photosensitive film on the surface, conducting a photolithography process and a developing process. The remaining photosensitive film is retained and integrated into the 3D semiconductor structure.

A term "plating" or "plated" is used in the present disclosure to describe an operation of forming a film or a layer on a surface. The plating operation includes various steps and processes and varies in accordance with the features of embodiments. The film or layer been plated on the surface is a single film or a composite stack. In some embodiments, a plating operation is adopted to form a metallic film. In some embodiments, a plating operation includes forming a seed layer and electroplating a metallic film on the seed layer. In some embodiments, a plating operation is a vapor deposition process. In some embodiments, a plating operation is a sputtering process.

A term "filling" or "filled" is used in the present disclosure to describe an operation of forming material in a hole. The filling operation includes various steps and processes and varies in accordance with the features of embodiments. In some embodiments, a filling operation includes forming a conductive material in a hole. In some embodiments, a filling operation includes forming a liner on the sidewalls of the hole and forming a conductive film on the liner. In some embodiments, a filling operation includes a electroplating process. In some embodiments, a filling operation includes a vapor deposition process. In some embodiments, a filling operation includes a sputtering process.

Figure 7A:
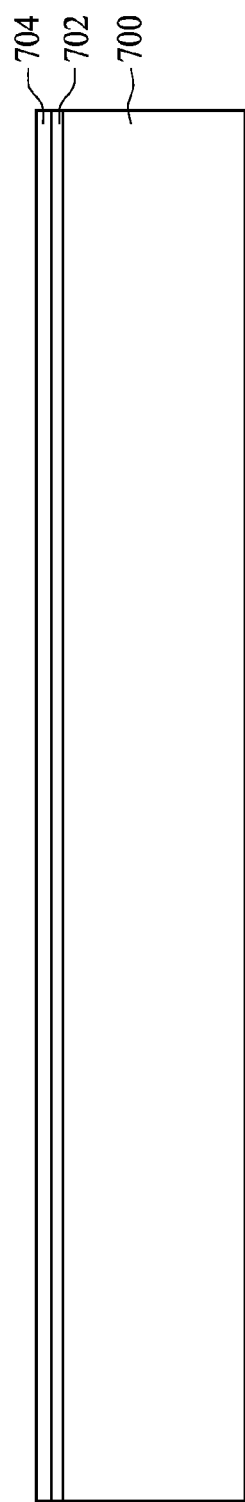
FIG. 7A-7M are operations of a method of manufacturing a three dimensional semiconductor structure.

In FIG. 7A, a carrier 700 is provided to form a 3D semiconductor structure thereon. The carrier 700 is a substrate designed to from the 3D semiconductor structure thereon. Shape of the carrier can be different according to the design. In some embodiments, the shape of the carrier is round. In some embodiments, the carrier is silicon or silicon oxide. In some embodiments, the carrier is removed after the 3D semiconductor structure is formed. For some embodiments as in FIG. 7A, a glue layer 702 is disposed on the carrier 700. The glue layer 702 acts as a detachable bonding layer to bind a film or structure to the carrier 700. The carrier 700 can be removed from the structure attached thereon by degrading the glue layer 702. A base buffer 704 is disposed on the glue layer 702. The base buffer layer 704 is formed with material such as polyimide, PBO, SR, LTHC (light to heat conversion film), wafer backside coating tape, and ABF, or the like. In some embodiments, the base buffer layer 704 includes at least two layers with different materials.

Figure 7B:
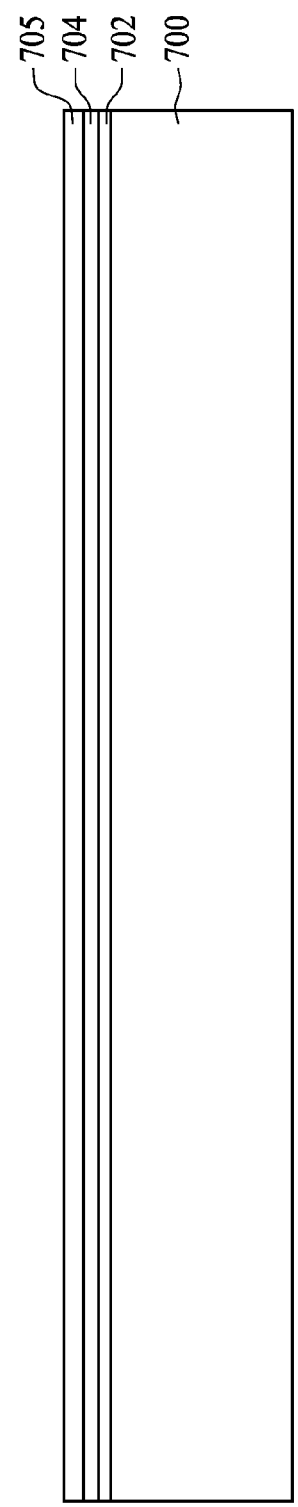

In FIG. 7B, a seed layer 705 is formed over the top surface of the carrier 700. The seed layer 705 is a single layer or a composite stack and formed with material such as copper, tantalum, tin, titanium/copper, tin/copper, tantalum/copper, or the like. The seed layer 705 provides growing sites to promote an electroplating operation. In some embodiments, a sputtering or vapor deposition process is employed to form a seed layer over the carrier 700.

Figure 7C:
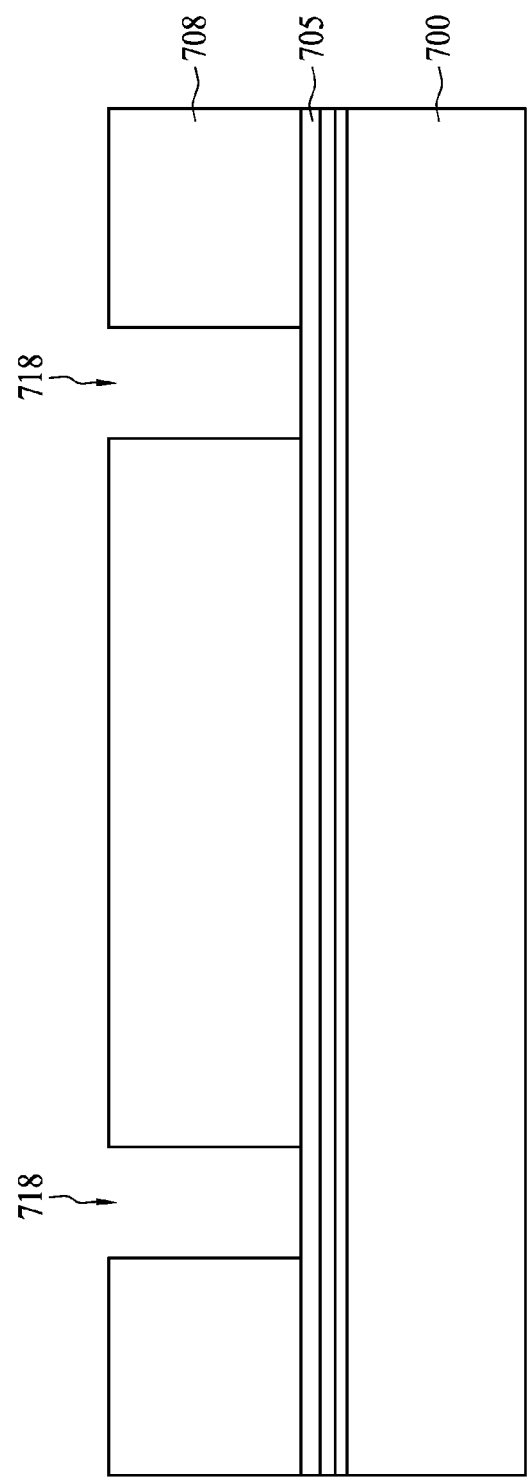

FIG. 7C is an operation of forming a patterned layer 708 on the seed layer 705. In some embodiments, the patterned layer 708 is formed with a photoresist such as polyimide by a spin coating process. The patterned layer 708 has two or more through structures 718.

Figure 7D:
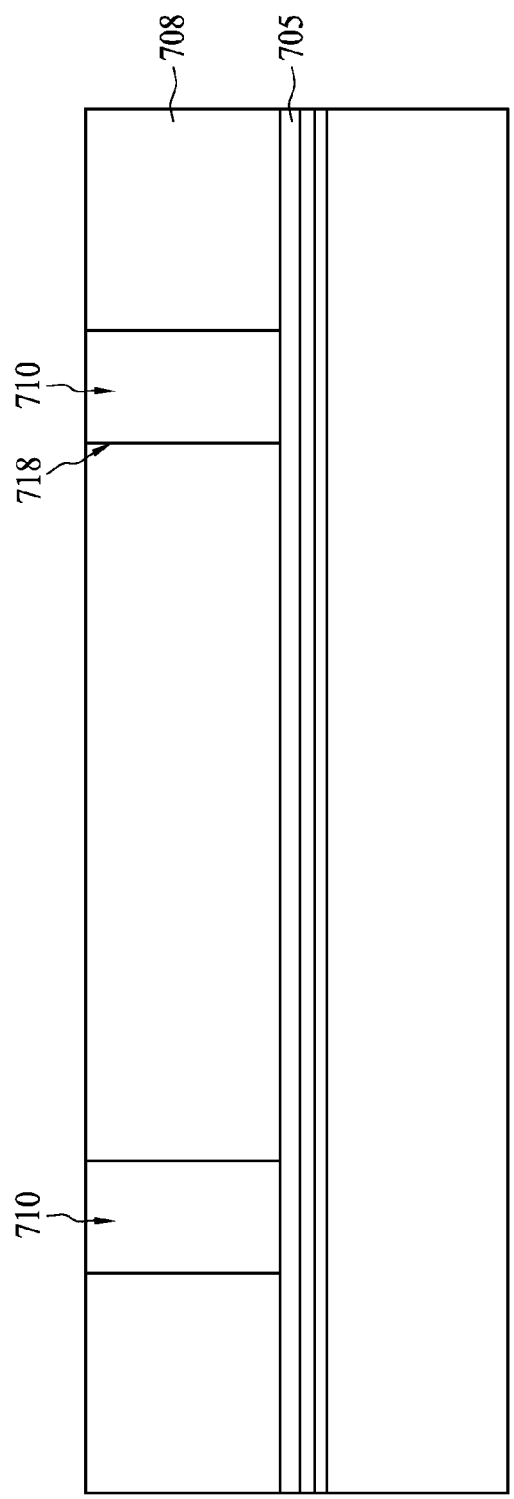

In FIG. 7D, the through structures 718 is filled with an electrically conductive material 710. An electroplating or a sputter process can be adopted to form conductive material in the through structures.

Figure 7E:
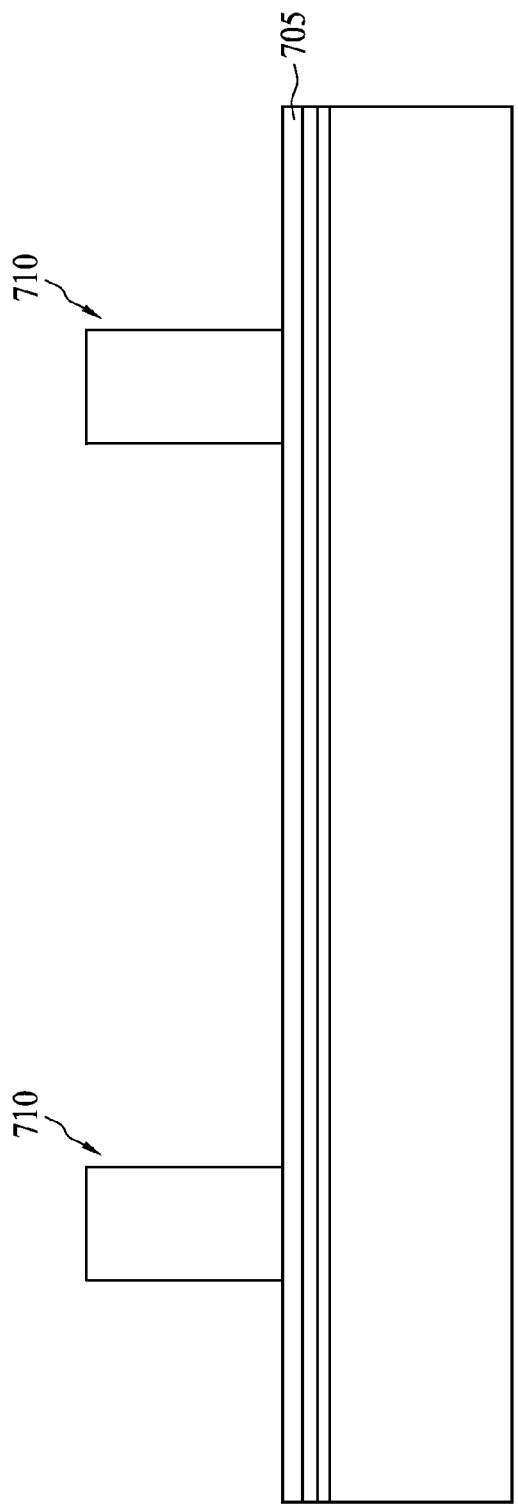
Figure 7F:
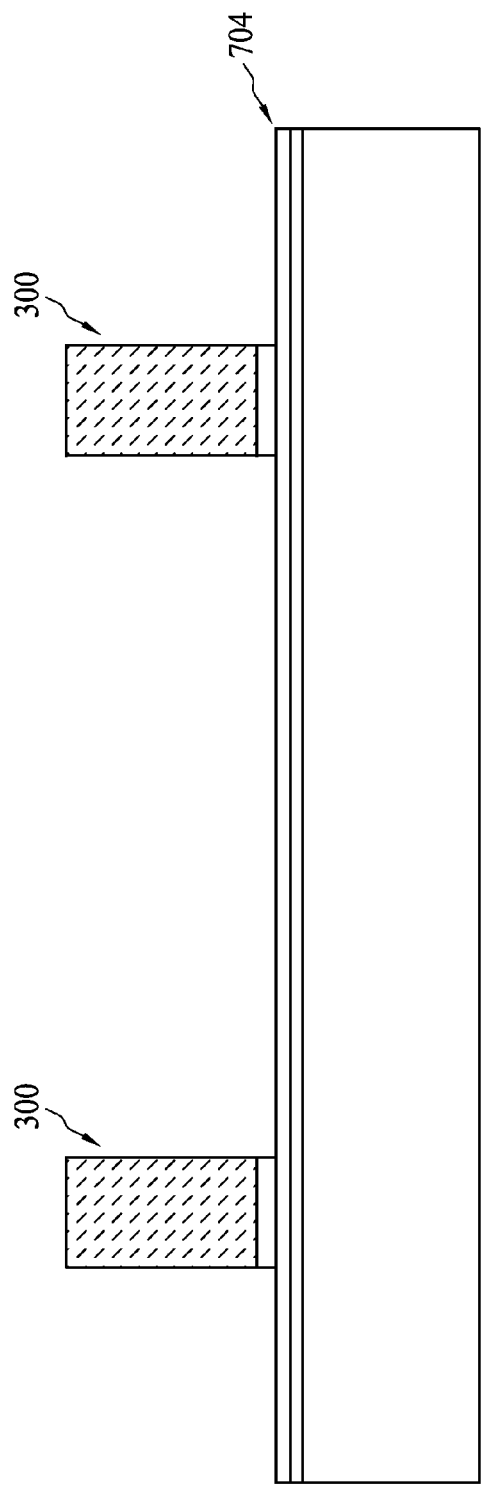

FIG. 7E is an operation of stripping the patterned layer from the top surface of the seed layer 705. The stripping operation is a selective cleaning process to remove only the patterned layer without damaging the electrically conductive material. Post-like electrically conductive material 710 is preserved after the stripping operation. FIG. 7F is an operation of removing the seed layer that is located between the conductive posts and only the portion under the conductive posts still remains. In some embodiments, the seed layer is a metal; to remove the seed layer between conductive plugs can prevent electrically communication between the conductive plugs. The remained seed layer and conductive post form several conductive plugs 300 on the base buffer 704.

Figure 7G:
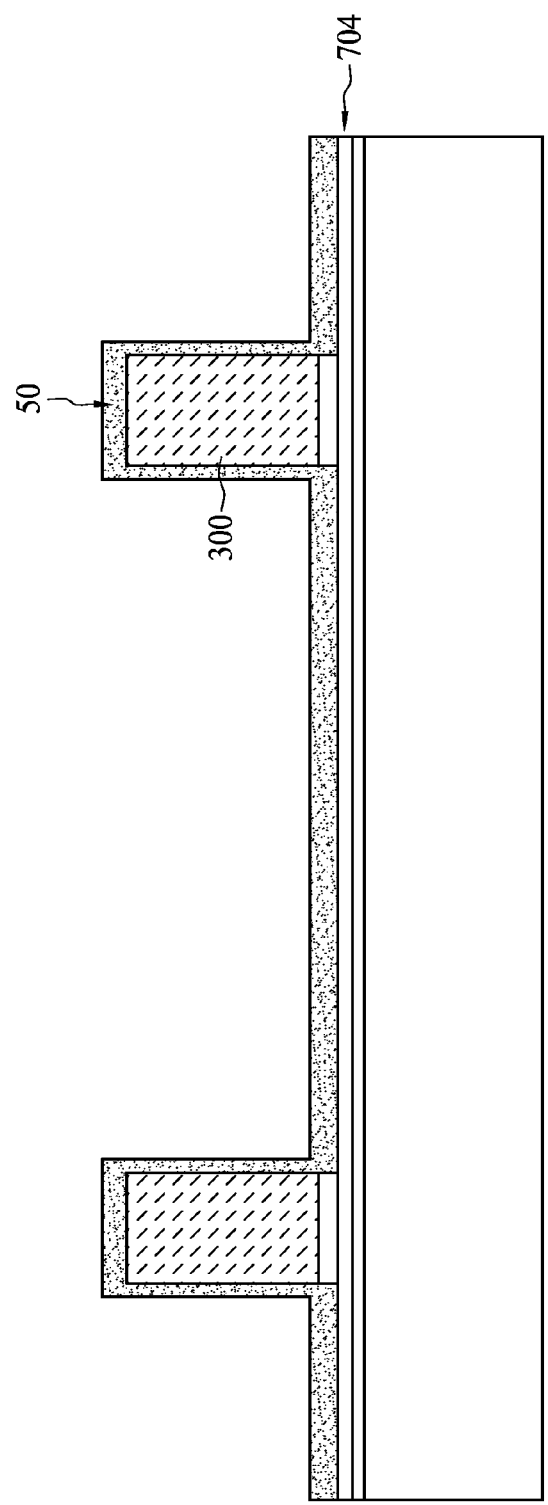

FIG. 7G is an operation of forming a liner or stress buffer 50 on the conductive plugs 300 and the base buffer 704. The liner or stress buffer 50 is a stress buffer layer. In some embodiments, the liner or stress buffer 50 is formed with an electroless plating process. A metal layer is formed on the conductive plugs 300 and the base buffer 704 before electroless plating the liner or stress buffer 50. In some embodiments, the metal layer is tin. In some embodiments, the liner or stress buffer 50 is formed with a vapor deposition process. In some embodiments, the liner or stress buffer 50 is a polymer. Spin coating is employed to form a liner on the conductive plugs for some embodiments. Materials such as spin-on glass or polyimide are adopted to form the liner.

Figure 7H:
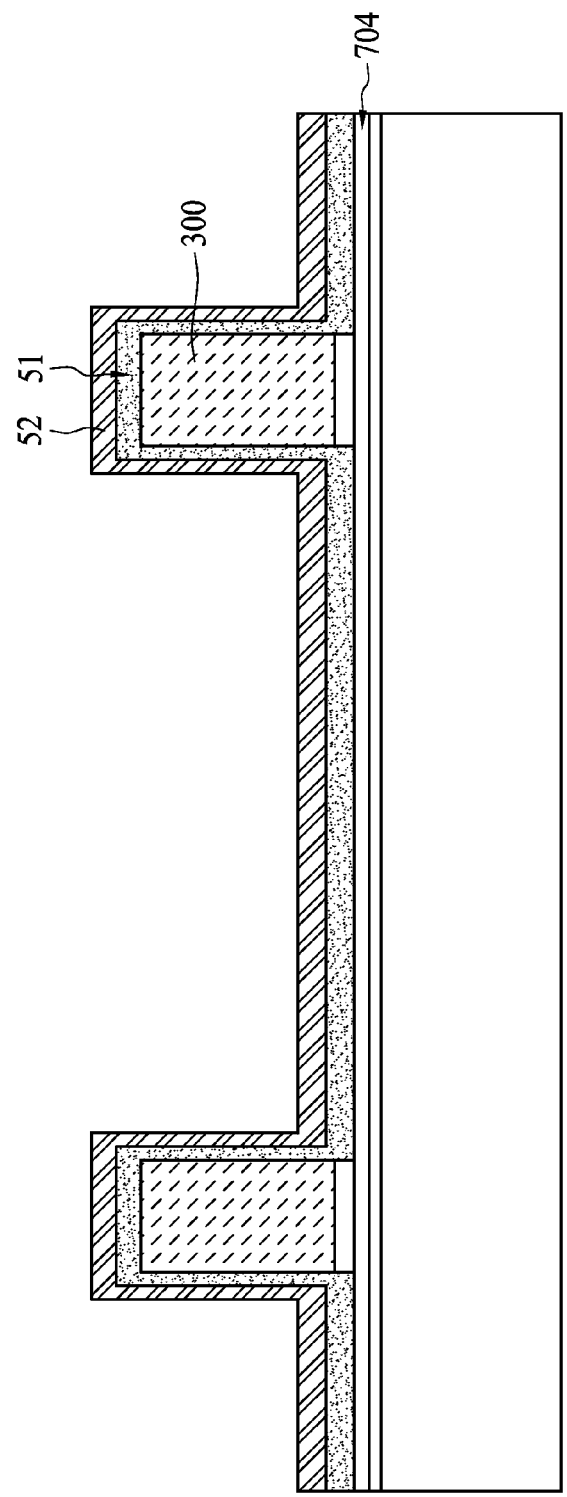

In some embodiments, a liner is designed as a stress buffer including at least two different films. As in FIG. 7H, the liner is a composite film including a first stress buffer layer 51 and a second stress buffer 52. The first stress buffer layer 51 is disposed on the conductive plug 300 and the top surface of the base buffer 704. The second stress buffer layer 52 is disposed on the first stress buffer layer 51. In some embodiments, a different process forms each stress buffer layer. For example, the first stress buffer layer is formed by electroless plating a tin layer on the conductive plugs and the base buffer. The second stress buffer is formed by spin coating a PBO layer on the first stress buffer layer. In some embodiments, the first stress buffer layer and the second stress buffer layer are formed in a same process. For example, the first stress buffer layer and the second stress buffer are formed by a vapor deposition. The first stress buffer layer is formed by disposing titanium on the conductive plugs and the base buffer. The second stress buffer layer is formed by disposing a titanium nitride on the first stress buffer layer. In some embodiments, an in-situ recipe is designed to form two different buffer layers in same manufacturing equipment.

Figure 7I:
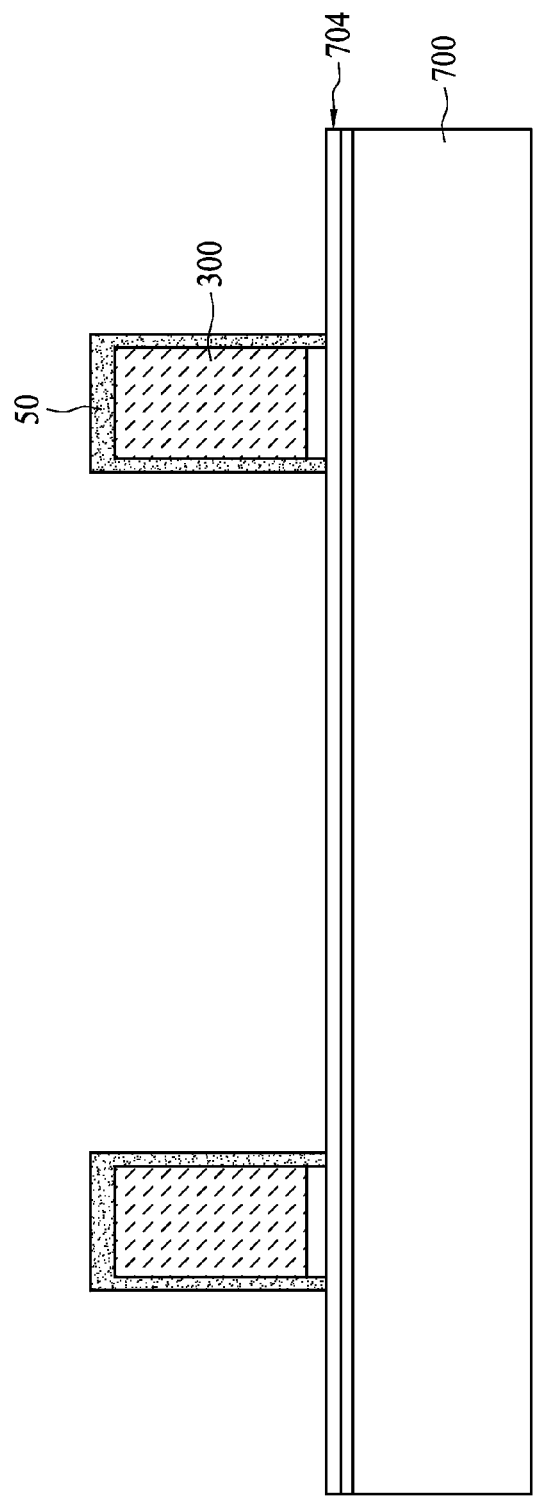

For embodiments with an electrically conductive liner or stress buffer, an additional removal operation is necessary to prevent short circuit between the conductive plugs. For example, if the liner is a tin film, an operation as in FIG. 7I is introduced to remove a portion of the liner or stress buffer that is disposed between the conductive plugs 300. The operation includes a step to mask the conductive plugs 300 before removing a portion of the liner 50. For embodiments with an electrically insulating liner, such as a PBO liner, the removal operation as in FIG. 7I is optional.

For certain embodiments, a liner or stress buffer is formed on the conductive plugs 300 without a seed layer disposed on the carrier 700. The liner of stress buffer is formed on the conductive plugs 300 by electroless plating. The liner or stress buffer is selectively formed on the conductive plugs 300. Thus, the removal operation as in FIG. 7I is skipped.

Figure 7J:
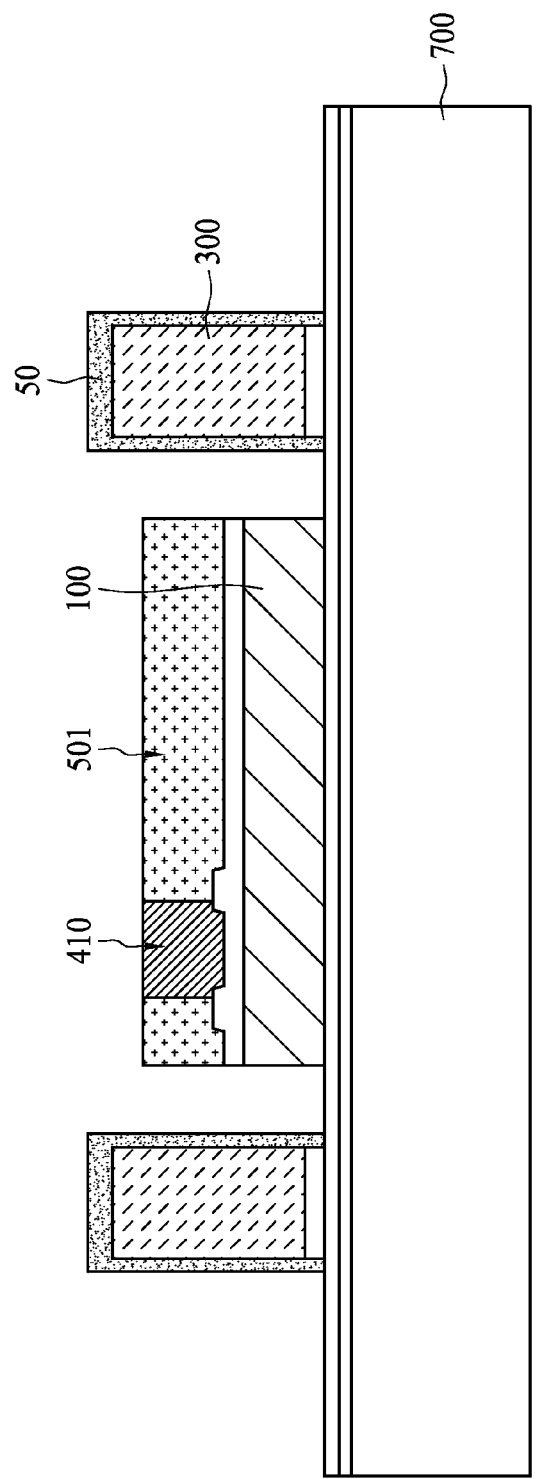

In FIG. 7J, a semiconductor chip 100 is placed on the carrier 700 and located between the conductive plugs 300. For certain embodiments, a die attached film (DAF) is disposed between the semiconductor chip 100 and the base buffer 704. The semiconductor chip 100 is covered by a first dielectric 501. A conductive pillar 410 is disposed on the semiconductor chip 100 in order to electrically communicate with an interconnect. In some embodiments, the first dielectric 501 is formed on the semiconductor chip 100 after the semiconductor chip is placed on the carrier 700. In some embodiments, the first dielectric 501 is pre-formed on the semiconductor chip 100 before placing the chip 100 is placed on the carrier 700.

Figure 7K:
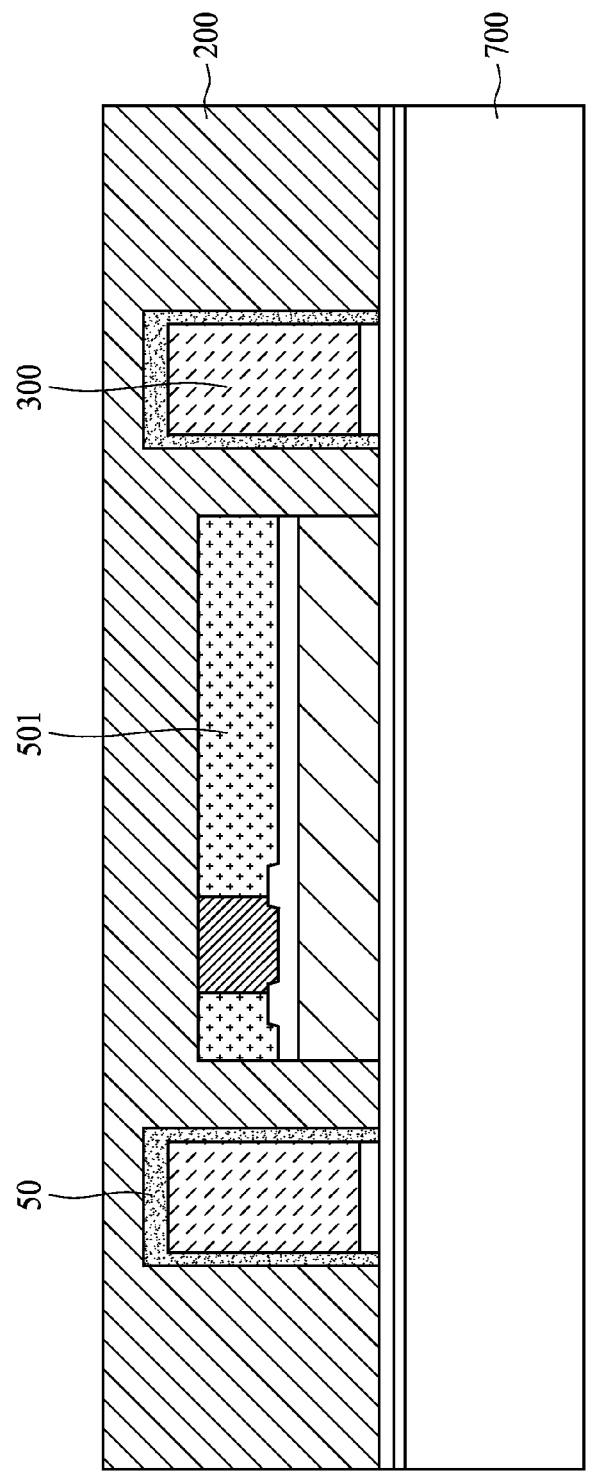

FIG. 7K is an operation of disposing molding compound on a carrier. Molding compound 200 is formed by coating, injection, or compress and placed on the carrier 700. The molding compound 200 also covers the conductive plugs 300. For some embodiments, if the conductive plugs are with small pitch, a liquid molding compound (LMC) is selected to fill in small gaps. A curing process can be implemented after forming the molding compound in order to harden the molding compound.

Figure 7L:
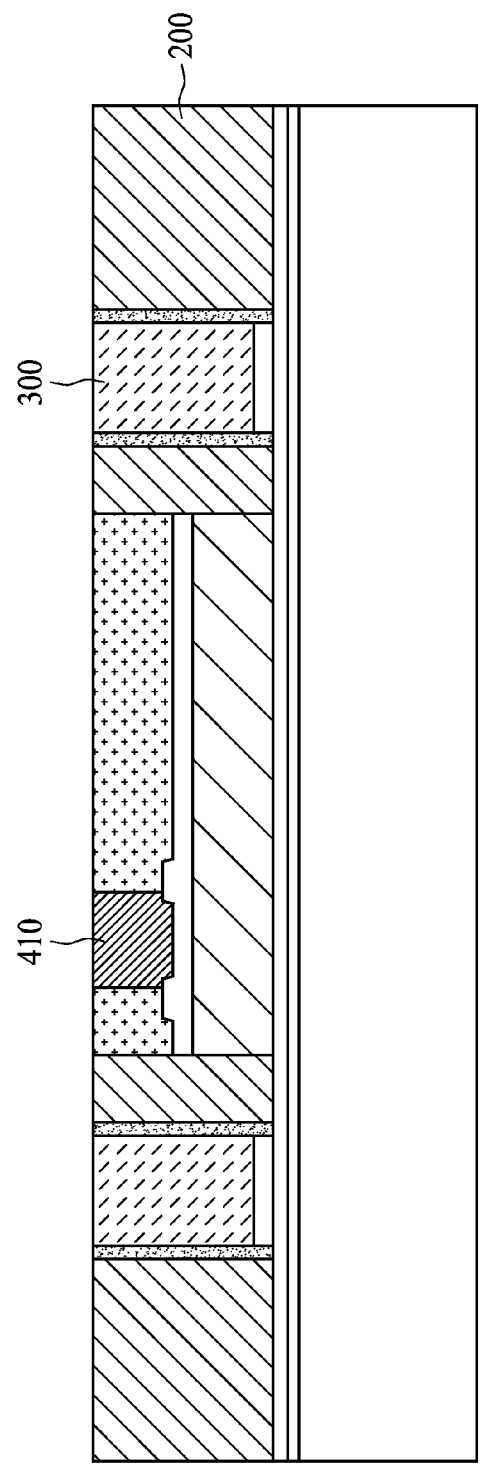

The method of manufacturing a 3D semiconductor structure includes a grinding process as in FIG. 7L to expose the conductive pillar 410. The grinding process is a blanket removal process so that the molding compound 200, the conductive plugs 300 are ground to a same level as the conductive pillar 410.

Figure 7M:
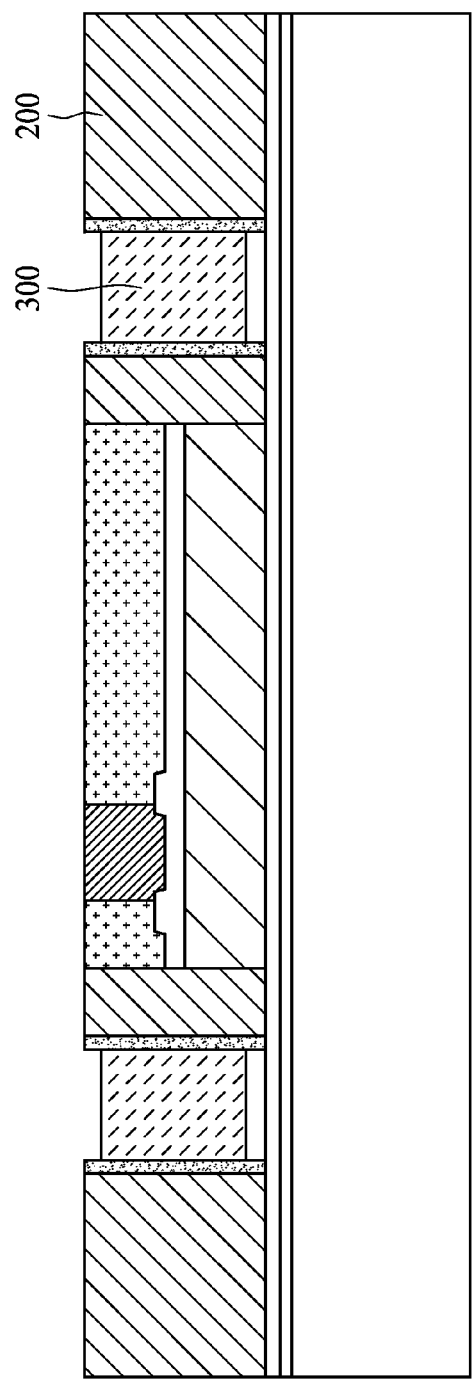

In some embodiments, the conductive plug 300 is made with a softer material than the molding compound 200. Debris of removed conductive filled via or plug material is trapped in the molding compound 200. A clean operation is adopted to selectively remove a certain amount of conductive plug to ensure that no electrically conductive residues are embedded in the molding compound 200. As in FIG. 7M, the conductive filled via or plug 300 has a recessed top surface, which is below the top surface of the molding compound 200.

Figure 8A:
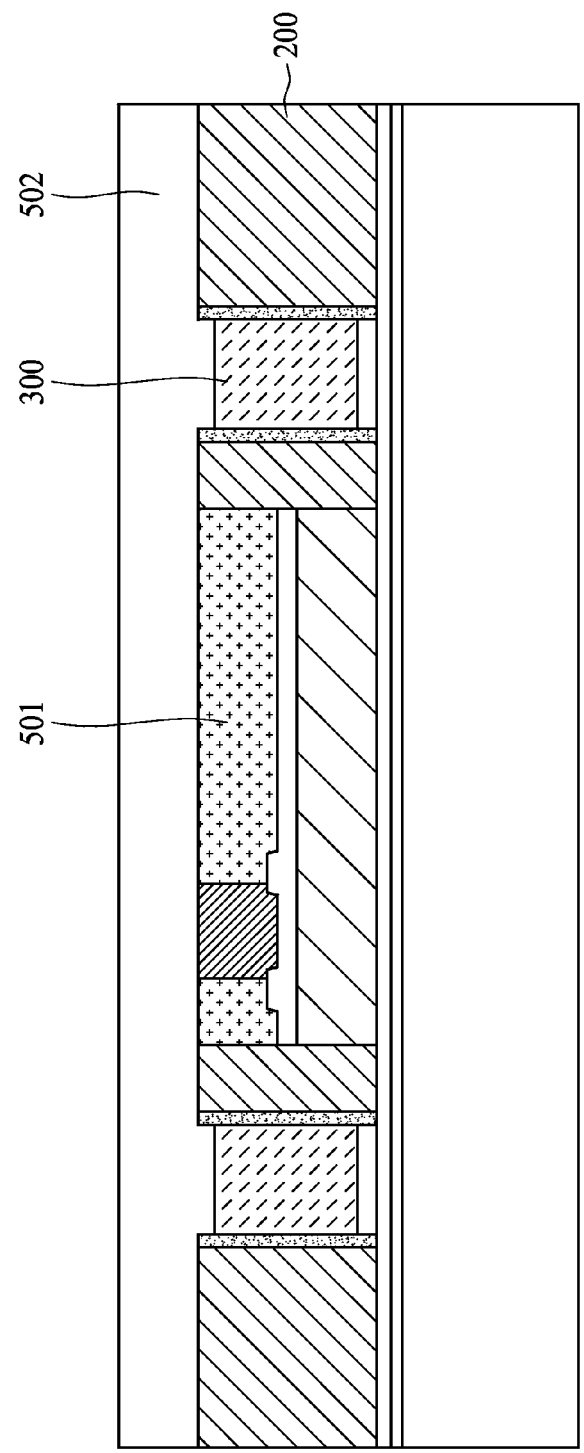
FIG. 8A-8D are operations of a method of manufacturing a three dimensional semiconductor structure.

FIG. 8A is a 3D semiconductor structure according to present disclosure. The 3D semiconductor structure has several conductive filled vias or plugs 300 and each conductive plug has a recessed top surface. A second dielectric 502 is formed on a molding compound 200 and a first dielectric 501. The second dielectric 502 also fills in the recesses of the conductive plugs 300. In some embodiments, the second dielectric 502 is formed with a material same as the first dielectric 501. In some embodiments, the material for the second dielectric 502 is different from the first dielectric 501.

Figure 8B:
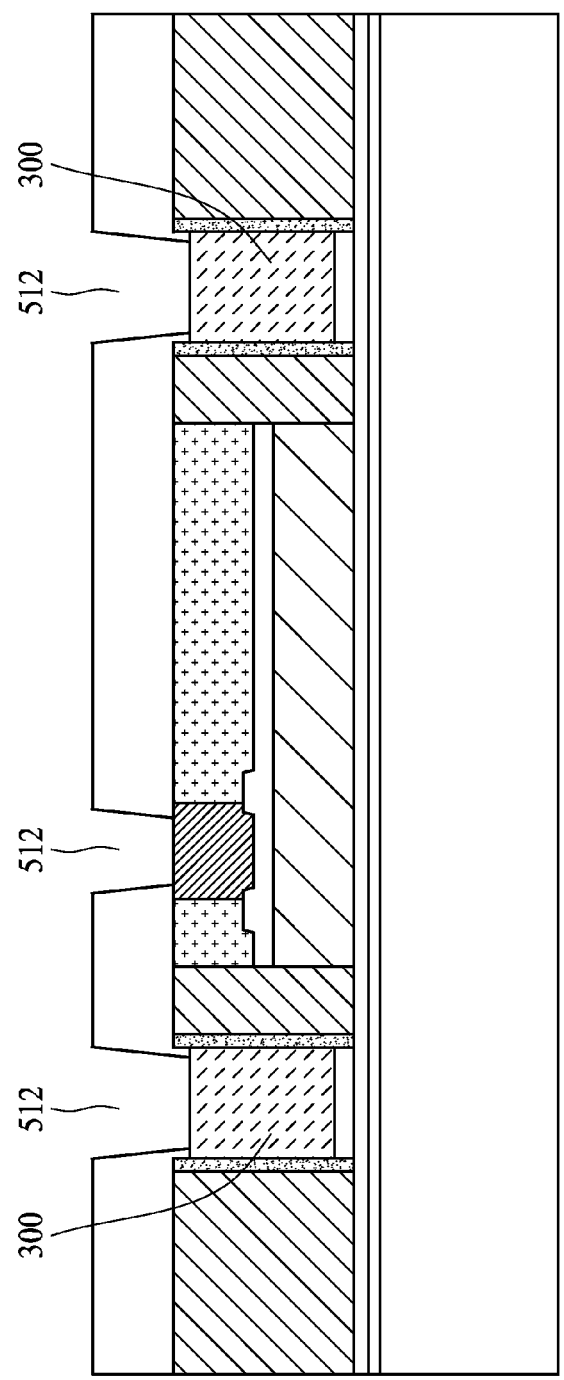
Figure 8C:
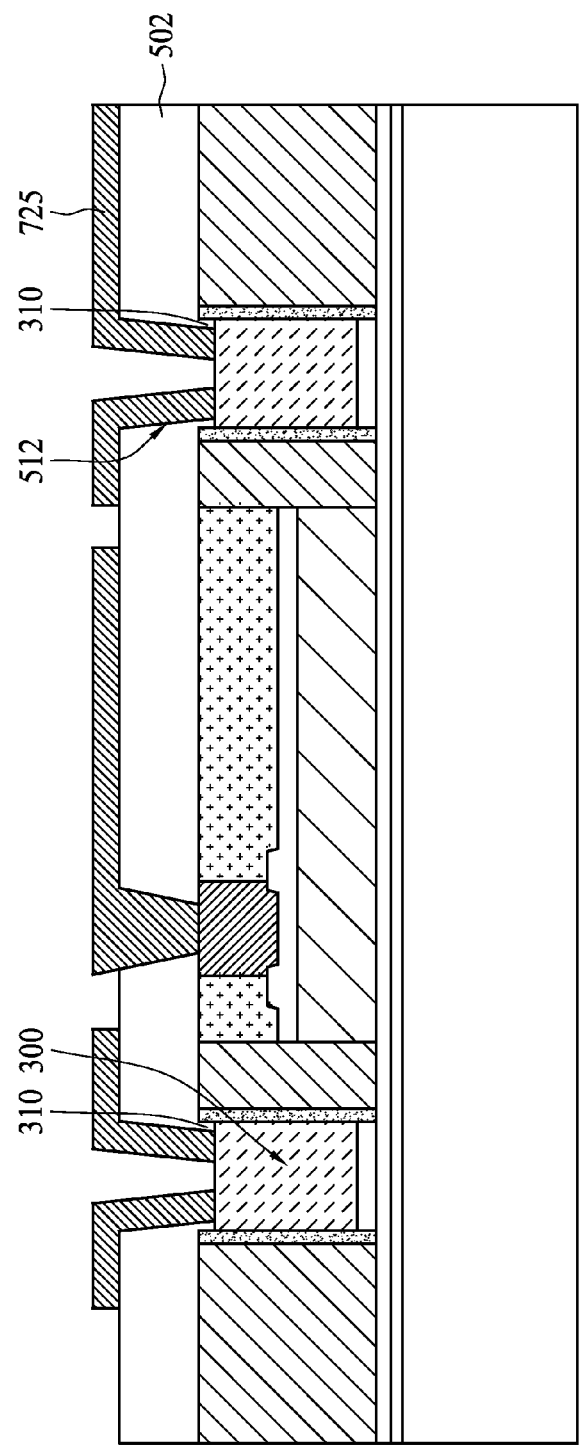

In FIG. 8B, the second dielectric 502 is patterned to have several through structures 512. The top surface of the conductive filled via or plug 300 is exposed at the bottom opening of the through structures 512. In FIG. 8C, a conductive film 725 is formed on the second dielectric 502, the conductive filled vias or plugs 300 and in the through structures 512. The conductive plug 300 includes a recess 310 at a top corner of the conductive plug 300. The recess 310 is filled with the second dielectric 502. The recess 310 has a ring shape.

Figure 8D:
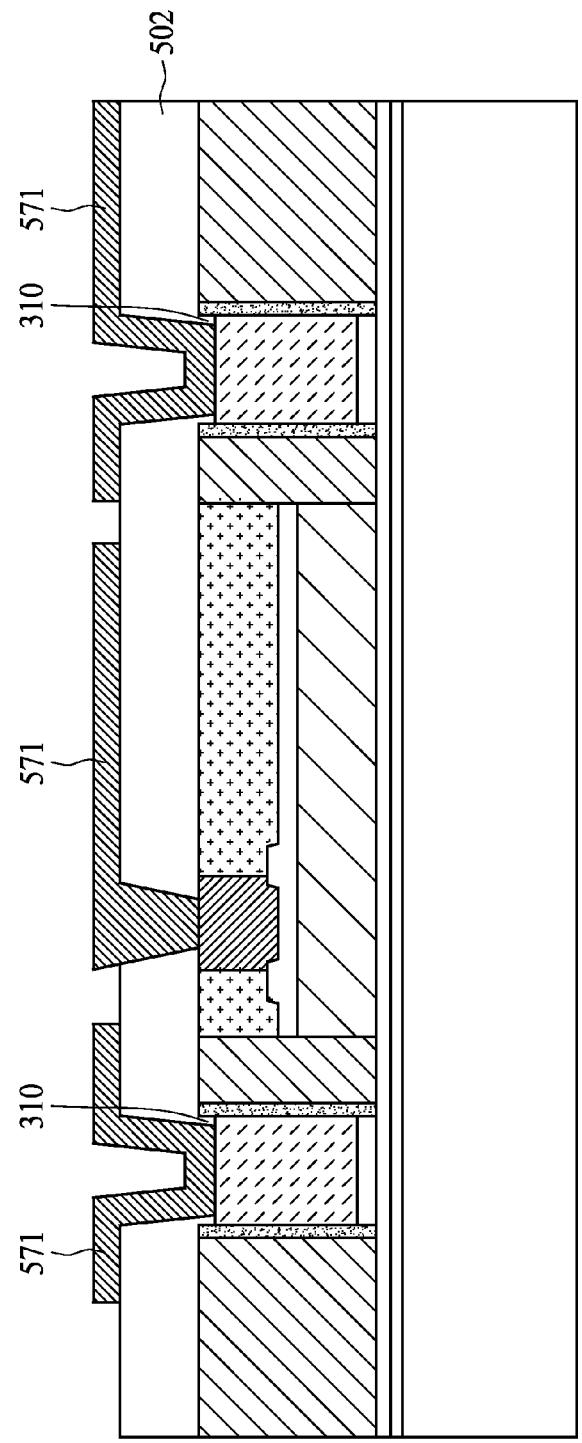

The conductive film is patterned to be an RDL 571 as in FIG. 8D. In some embodiments, a 3D semiconductor structure includes RDL distributed in different layers.

Figure 9:
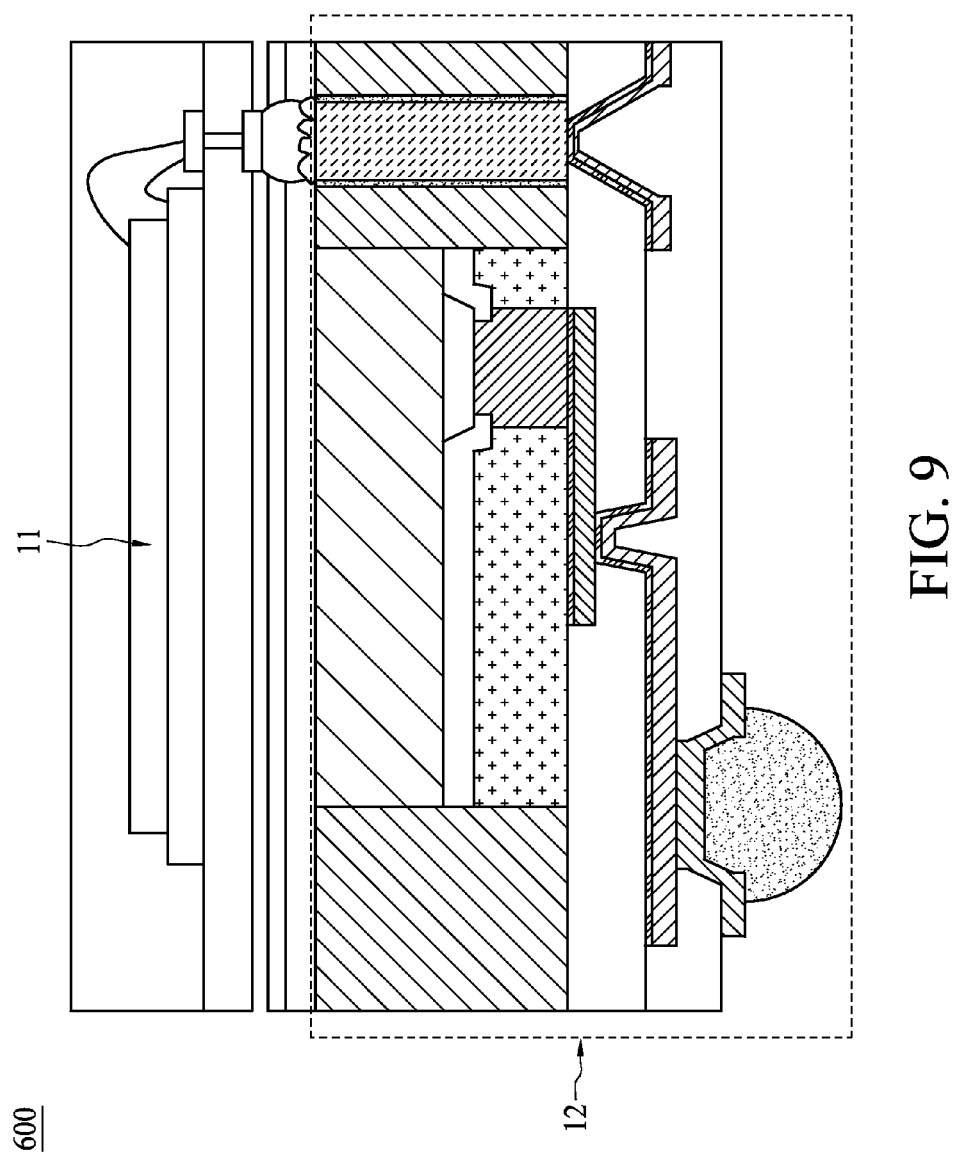
FIG. 9 is an integrated 3D IC package 600 according to the present disclosure.

FIG. 9 is an integrated 3D IC package 600. The integrated 3D IC package 600 includes the 3D semiconductor structure 12 as in FIG. 1 and a memory chip 11. The 3D semiconductor structure 12 has a liner or stress buffer layer 50. The memory chip 11 is electrically connect with the 3D semiconductor structure 12.

A fan-out package includes a molding compound, a conductive plug and a stress buffer. The conductive plug is in the molding compound. The stress buffer is between the conductive plug and the molding compound. The stress buffer has a coefficient of thermal expansion (CTE). The CTE of the stress buffer is between a CTE of the molding compound and a CTE of the conductive plug. A method of manufacturing a three dimensional includes plating a post on a substrate, and disposing a stress buffer on the sidewall of the post. The method further includes surrounding the stress buffer with a molding compound.

A semiconductor structure includes a molding compound, a filled via and a liner. The filled via is in the molding compound. The liner is between the molding compound and the filled via. The liner is tin, tungsten, zirconium, gold, palladium, polyimide, ENEPIG, ENEP, or PBO.

A method of manufacturing a three dimensional semiconductor package. The manufacturing method includes plating a post on a substrate, and disposing a stress buffer on the sidewall of the post. The method further includes surrounding the stress buffer with a molding compound.

The methods and features of this invention have been sufficiently described in the above examples and descriptions. It should be understood that any modifications or changes without departing from the spirit of the invention are intended to be covered in the protection scope of the invention.

What is claimed is:

1. A fan out package, comprising:
   a molding compound;
   a conductive plug in the molding compound; and
   a stress buffer between the conductive plug and the molding compound, wherein a coefficient of thermal expansion (CTE) of the stress buffer is between a CTE of the molding compound and a CTE of the conductive plug, and the stress buffer is a composite film, and stress buffer layers of the composite film have increasing CTE away from the conductive plug.

2. The fan out package in claim 1, wherein a thickness of the stress buffer is between about 0.2 μm and about 5 μm.

3. The fan out package in claim 1, wherein a top surface of the conductive plug is below a top surface of the molding compound.

4. The fan out package in claim 1, wherein a portion of the conductive plug contacts the molding compound.

5. The fan out package in claim 1, further comprising an interconnect over and contacting the conductive plug, wherein the interconnect contacts a portion of the top surface of the conductive plug.

6. A semiconductor structure, comprising:
a molding compound;
a filled via in the molding compound; and
a liner between the molding compound and the filled via, wherein the liner is tin, tungsten, zirconium, gold, palladium, polyimide, ENEPIG, ENEP, or PBO, and the liner is a composite film, and liner layers of the composite film have increasing CTE away from the filled via.

7. The semiconductor structure in claim 6, wherein the liner is further disposed on a bottom surface of the molding compound.

8. The semiconductor structure in claim 6, wherein the thickness of the liner is between about 0.2 μm and about 5 μm.

9. The semiconductor structure in claim 6, wherein a CTE of the liner is between about 9 ppm and about 80 ppm.

10. The semiconductor structure in claim 6 wherein the filled via is recessed at a top corner of the liner.

11. The semiconductor structure in claim 10, wherein the recess of the filled via is in a ring shape.

12. A method of manufacturing a three dimensional semiconductor package, comprising:
plating a post on a substrate;
disposing a first stress buffer layer on sidewalls of the post;
forming a second stress buffer layer on the first stress buffer layer; and
surrounding the first stress buffer layer with a molding compound.

13. The method in claim 12 wherein the disposing a first stress buffer layer includes covering the substrate with the first stress buffer layer.

14. The method in claim 13 further comprising removing the first stress buffer layer from the substrate.

15. The method in claim 12 further comprising grinding the molding compound to expose a top surface of the post.

16. The method in claim 12 further comprising removing a portion of the post.

17. The method of claim 12, wherein the disposing a first stress buffer layer comprises spin-coating or vapor depositing a first stress buffer layer on the sidewalls of the post.

* * * * *